(12) United States Patent
Wang et al.

(10) Patent No.: US 11,173,697 B2
(45) Date of Patent: Nov. 16, 2021

(54) LIGHT ASSISTED PLATELET FORMATION FACILITATING LAYER TRANSFER FROM A SEMICONDUCTOR DONOR SUBSTRATE

(71) Applicant: GlobalWafers Co., Ltd., Hsinchu (TW)

(72) Inventors: Gang Wang, Grover, MO (US); Charles Lottes, Ballwin, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 357 days.

(21) Appl. No.: 16/379,117

(22) Filed: Apr. 9, 2019

(65) Prior Publication Data

US 2019/0329542 A1 Oct. 31, 2019

Related U.S. Application Data

(60) Provisional application No. 62/663,357, filed on Apr. 27, 2018.

(51) Int. Cl.
*H01L 21/265* (2006.01)
*H01L 21/324* (2006.01)
(Continued)

(52) U.S. Cl.
CPC ........ *B32B 43/006* (2013.01); *H01L 21/0201* (2013.01); *H01L 21/02008* (2013.01);
(Continued)

(58) Field of Classification Search
CPC ........... H01L 21/0223; H01L 21/02233; H01L 21/02236; H01L 21/02238; H01L 21/02241; H01L 21/26506; H01L 21/2654; H01L 21/3165; H01L 21/31654; H01L 21/31658; H01L 21/31662; H01L 21/32105; H01L 21/324; H01L 21/3245; H01L 21/3247; H01L 21/425; H01L 21/477; H01L 21/673; H01L 21/76254; B23B 43/006; B23B 2457/14
See application file for complete search history.

(56) References Cited

U.S. PATENT DOCUMENTS 4,501,060 A  2/1985  Frye et al.
4,755,865 A  7/1988  Wilson et al.
(Continued)

FOREIGN PATENT DOCUMENTS

EP  0939430 A2  1/1999
EP  1624482 A2  2/2006
(Continued)

OTHER PUBLICATIONS

International Search Report and Written Opinion issued for Application No. PCT/US2019/026123, dated Jul. 3, 2019 (14 pages).

*Primary Examiner* — Eduardo A Rodela
*Assistant Examiner* — Christopher M Roland
(74) *Attorney, Agent, or Firm* — Armstrong Teasdale LLP

(57) ABSTRACT

A method is disclosed for promoting the formation of uniform platelets in a monocrystalline semiconductor donor substrate by irradiating the monocrystalline semiconductor donor substrate with light. The photon-absorption assisted platelet formation process leads to uniformly distributed platelets with minimum built-in stress that promote the formation a well-defined cleave-plane in the subsequent layer transfer process.

43 Claims, 6 Drawing Sheets

(51) Int. Cl.
  *H01L 21/322* (2006.01)
  *B32B 43/00* (2006.01)
  *H01L 21/02* (2006.01)
  *H01L 21/762* (2006.01)

(52) U.S. Cl.
  CPC .. *H01L 21/02236* (2013.01); *H01L 21/02241* (2013.01); *H01L 21/2654* (2013.01); *H01L 21/26506* (2013.01); *H01L 21/324* (2013.01); *H01L 21/3247* (2013.01); *B32B 2457/14* (2013.01); *H01L 21/02005* (2013.01); *H01L 21/322* (2013.01); *H01L 21/3221* (2013.01); *H01L 21/76243* (2013.01); *H01L 21/76254* (2013.01)

(56) References Cited

U.S. PATENT DOCUMENTS

| | | | |
|---|---|---|---|
| 4,968,384 A | 11/1990 | Asano | |
| 5,189,500 A | 2/1993 | Kusunoki | |
| 6,043,138 A | 3/2000 | Ibok | |
| 6,191,009 B1 | 2/2001 | Tamatsuka et al. | |
| 6,346,459 B1 | 2/2002 | Usenko et al. | |
| 6,373,113 B1 | 4/2002 | Gardner et al. | |
| 6,534,380 B1 * | 3/2003 | Yamauchi | H01L 21/76254 257/E21.568 |
| 6,562,127 B1 | 5/2003 | Kud et al. | |
| 6,624,047 B1 | 9/2003 | Sakaguchi et al. | |
| 7,311,775 B2 | 12/2007 | Kusaba et al. | |
| 7,387,676 B2 | 6/2008 | Ammon et al. | |
| 7,732,352 B2 | 6/2010 | Mun et al. | |
| 7,759,227 B2 | 7/2010 | Maeda et al. | |
| 7,868,419 B1 | 1/2011 | Kerr et al. | |
| 7,879,699 B2 | 2/2011 | Schulze et al. | |
| 7,915,706 B1 | 3/2011 | Kerr et al. | |
| 8,058,137 B1 | 11/2011 | Or-Bach et al. | |
| 8,076,750 B1 | 12/2011 | Kerr et al. | |
| 8,187,954 B2 | 5/2012 | Hayamizu et al. | |
| 8,466,036 B2 | 6/2013 | Brindle et al. | |
| 8,481,405 B2 | 7/2013 | Arriagada et al. | |
| 8,796,116 B2 | 8/2014 | Grabbe et al. | |
| 8,846,493 B2 | 9/2014 | Libbert et al. | |
| 8,859,393 B2 | 10/2014 | Ries et al. | |
| 9,202,711 B2 | 12/2015 | Liu et al. | |
| 2002/0090758 A1 | 7/2002 | Henley et al. | |
| 2004/0005740 A1 | 1/2004 | Lochtefeld et al. | |
| 2004/0031979 A1 | 2/2004 | Lochtefeld et al. | |
| 2004/0108537 A1 | 6/2004 | Tiwari | |
| 2005/0153524 A1 | 7/2005 | Maa et al. | |
| 2006/0030124 A1 | 2/2006 | Maa et al. | |
| 2006/0226482 A1 | 10/2006 | Suvorov | |
| 2007/0032040 A1 | 2/2007 | Lederer | |
| 2007/0037363 A1 | 2/2007 | Aspar et al. | |
| 2007/0054466 A1 | 3/2007 | Hebras | |
| 2007/0212852 A1 | 9/2007 | Tauzin et al. | |
| 2008/0014714 A1 | 1/2008 | Bourdelle et al. | |
| 2009/0004833 A1 | 1/2009 | Suzuki et al. | |
| 2009/0014828 A1 | 1/2009 | Mizushima et al. | |
| 2009/0033110 A1 | 2/2009 | Fragale | |
| 2009/0087631 A1 | 4/2009 | Schulze et al. | |
| 2009/0092810 A1 | 4/2009 | Lee et al. | |
| 2009/0197396 A1 | 8/2009 | Qu | |
| 2009/0321829 A1 | 12/2009 | Nguyen et al. | |
| 2010/0105191 A1 | 4/2010 | Hayamizu et al. | |
| 2010/0127343 A1 | 5/2010 | Daigler et al. | |
| 2011/0159665 A1 | 6/2011 | Witte et al. | |
| 2011/0174362 A1 | 7/2011 | Tanner et al. | |
| 2011/0298083 A1 | 12/2011 | Yoneda | |
| 2012/0003815 A1 * | 1/2012 | Lee | H01L 21/76254 438/458 |
| 2012/0016310 A1 | 1/2012 | Holliday et al. | |
| 2012/0077331 A1 * | 3/2012 | Sameshima | H01L 21/76254 438/459 |
| 2012/0091587 A1 | 4/2012 | Or-Bach et al. | |
| 2012/0119323 A1 * | 5/2012 | Akiyama | H01L 21/268 257/507 |
| 2012/0238070 A1 | 9/2012 | Libbert et al. | |
| 2012/0267681 A1 | 10/2012 | Nemoto et al. | |
| 2013/0093060 A1 | 4/2013 | Oka et al. | |
| 2013/0120951 A1 | 5/2013 | Zuo et al. | |
| 2013/0122672 A1 | 5/2013 | Or-Bach et al. | |
| 2013/0168835 A1 | 7/2013 | Botula et al. | |
| 2013/0193445 A1 | 8/2013 | Dennard et al. | |
| 2013/0294038 A1 | 11/2013 | Landru et al. | |
| 2013/0344680 A1 | 12/2013 | Arriagada et al. | |
| 2014/0042598 A1 | 2/2014 | Kitada et al. | |
| 2014/0070215 A1 | 3/2014 | Bedell et al. | |
| 2014/0084290 A1 | 3/2014 | Allibert et al. | |
| 2014/0120654 A1 | 5/2014 | Fujii et al. | |
| 2014/0124902 A1 | 5/2014 | Botula et al. | |
| 2014/0273405 A1 | 9/2014 | Liu et al. | |
| 2015/0004778 A1 | 1/2015 | Botula et al. | |
| 2015/0115480 A1 | 4/2015 | Peidous et al. | |
| 2017/0372965 A1 * | 12/2017 | Nishibayashi | H01L 21/02527 |

FOREIGN PATENT DOCUMENTS

| | | |
|---|---|---|
| EP | 2437281 A1 | 4/2012 |
| EP | 2426701 A1 | 7/2012 |
| JP | 2009177194 A | 8/2009 |
| JP | 2012253364 A | 12/2012 |
| WO | 2009120407 A2 | 10/2009 |
| WO | 2012127006 A1 | 9/2012 |

* cited by examiner

LIGHT ASSISTED PLATELET FORMATION FACILITATING LAYER TRANSFER FROM A SEMICONDUCTOR DONOR SUBSTRATE

CROSS REFERENCE TO RELATED APPLICATIONS

This application claims the benefit of priority to U.S. Provisional Application Ser. No. 62/663,357, which was filed Apr. 27, 2018, the disclosure of which is hereby incorporated by reference as if set forth in its entirety.

FIELD OF THE INVENTION

The present invention relates generally to a method of preparing multilayer semiconductor devices. More particularly, the present invention relates to a method of preparing a semiconductor donor substrate prior to bonding to a carrier substrate.

BACKGROUND OF THE INVENTION

Semiconductor wafers are generally prepared from a single crystal ingot (e.g., a single crystal silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor wafer and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

SUMMARY OF THE INVENTION

Among the aspects of the present invention may be noted a method of preparing a monocrystalline semiconductor donor substrate. The method comprises implanting hydrogen ions, helium ions, or a combination of hydrogen ions and helium ions through a front surface of the monocrystalline semiconductor donor substrate to an average depth $D_1$ as measured from the front surface toward a central plane, wherein the monocrystalline semiconductor donor substrate comprises two major, generally parallel surfaces, one of which is the front surface of the monocrystalline semiconductor donor substrate and the other of which is a back surface of the monocrystalline semiconductor donor substrate, a circumferential edge joining the front and back surfaces of the monocrystalline semiconductor donor substrate, and the central plane between the front and back surfaces of the monocrystalline semiconductor donor substrate; and irradiating the front surface, the back surface, or both the front and the back surfaces of the monocrystalline semiconductor donor substrate with light at an intensity and duration sufficient to increase a temperature of the monocrystalline semiconductor donor substrate up to 450° C. and thereby form a cleave plane in the monocrystalline semiconductor donor substrate.

In another aspect, the present invention is directed to a method of preparing a multilayer structure. The method comprises implanting hydrogen ions, helium ions, or a combination of hydrogen ions and helium ions through a front surface of a monocrystalline semiconductor donor substrate to an average depth $D_1$ as measured from the front surface toward a central plane, wherein the monocrystalline semiconductor donor substrate comprises two major, generally parallel surfaces, one of which is the front surface of the monocrystalline semiconductor donor substrate and the other of which is a back surface of the monocrystalline semiconductor donor substrate, a circumferential edge joining the front and back surfaces of the monocrystalline semiconductor donor substrate, and the central plane between the front and back surfaces of the monocrystalline semiconductor donor substrate; irradiating the front surface, the back surface, or both the front and the back surfaces of the monocrystalline semiconductor donor substrate with light at an intensity and duration sufficient to increase a temperature of the monocrystalline semiconductor donor substrate up to 450° C. and thereby form a cleave plane in the monocrystalline semiconductor donor substrate; activating the monocrystalline semiconductor donor substrate having the cleave plane therein via oxygen plasma surface activation; bonding the activated front surface of the monocrystalline semiconductor donor substrate having the cleave plane therein to a surface of a carrier substrate to thereby form a bonded structure comprising the carrier substrate and the monocrystalline semiconductor donor substrate having the cleave plane; annealing the bonded structure; and cleaving the bonded structure along the cleave plane to thereby form a multilayer structure comprising the carrier substrate and a monocrystalline semiconductor device layer transferred from the monocrystalline semiconductor donor substrate.

DETAILED DESCRIPTION OF THE EMBODIMENT(S) OF THE INVENTION

Figure 1A:
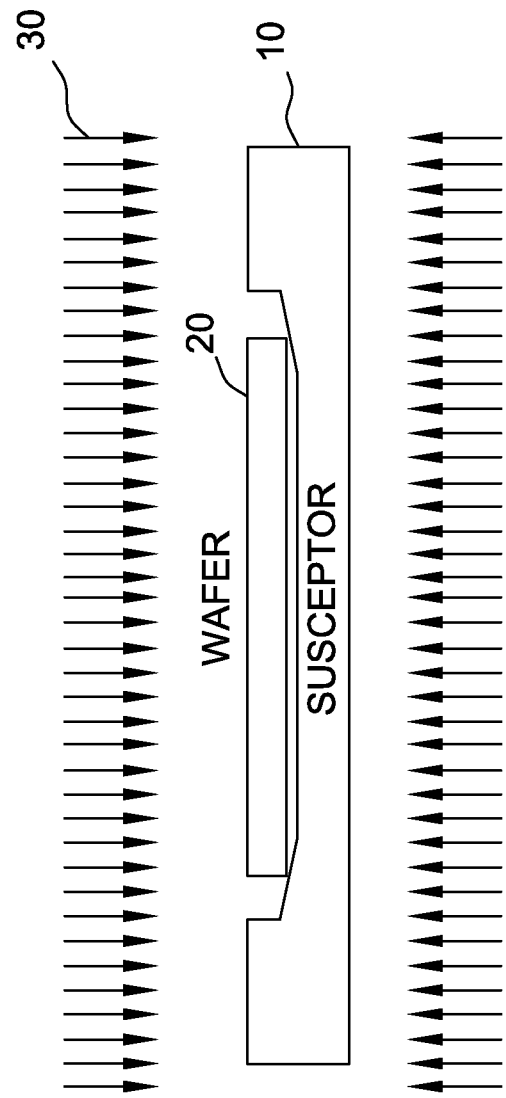
FIGS. 1A and 1B are alternative depictions of instrumentation suitable for carrying out the method according to the present invention.

The present invention is directed to a method for preparing a multilayer structure. The method of the present invention enables the formation of a uniform cleave plane in a semiconductor donor structure. The method according to the present invention promotes the formation of platelets in hydrogen implanted, helium implanted, or hydrogen and helium co-implanted semiconductor donor wafers by irradiating the donor structure with light. In some embodiments, the donors are irradiated with ultraviolet light, visible light, or infrared light. In some embodiments, the donors are irradiated with light with wavelength ranging from 0.3 micrometer (µM) to 3 micrometers. The absorption of photons by both the crystal lattice and point defects created during implantation promote the formation of platelets in a short-time scale, such as from milliseconds to up to tens of seconds. The photon-absorption assisted platelet formation process leads to uniformly distributed platelets with minimum built-in stress that promote the formation a well-defined cleave-plane in the subsequent layer transfer process, which advantageously achieves uniform layer transfer with minimum defectivity. In some embodiments, the invention provides a manufacturing process suitable for extremely demanding advanced products, such as Fully-Depleted Silicon-on-Insulator (FDSOI).

According to some embodiments of the method of the present invention, an implant of hydrogen ions, helium ions, or a combination of helium ions and hydrogen ions forms a damage layer in the donor substrate. In some embodiments, the implanted semiconductor donor structure is irradiated in light to thereby form platelets that define a cleave plane in the donor structure around the damage layer formed by implant. In some embodiments, the donor structure is thereafter bonded to a carrier structure, and the bonded structure is subjected to a cleaving operation to thereby transfer a layer from the donor structure to the carrier structure.

Conventional layer transfer methods may not provide precise control of platelet formation. Platelets may be formed during a pre-bond anneal or during anneal of the bonded structure. As the furnace anneal process is a relatively long process, platelet formation is facilitated by the diffusion of vacancies and implanted species. With increasing thermal budget, a fraction of the implanted species is lost by out-diffusion to the ambient atmosphere. Ostwald ripening process during the anneal leads to non-uniform platelets that created non-uniform stress in the layer to be transferred in the subsequent cleaving process. The overgrowth of large platelets can rupture prior to or during cleaving, which leads to a range of defects. Layer transfer defects are classified based on the root cause and size:

1. Voids. Voids are on the order of a few hundred micrometers or more in diameter. They are formed due to the particles trapped at the bond interface or cavities at the bond interface that are caused but the insufficient bond strength in combination of the gas accumulation from the implanted species;

2. Pullouts. These defects are typically in the range of micrometers in diameter. The mechanism of formation is like that of void;

3. Large area defects. These defects are typically sub-micrometer in size. They defects are caused by the inhomogeneous formation and Ostwald ripening process of platelets that created non-uniform local stress and layer rupture; and 4. Light point defects. These defects include individual fine points of reflected light seen when the wafer is illuminated by a narrow-beam light source held perpendicular to the wafer surface. These defects are on the order of nanometer to micrometer in size. These defects are most often formed in the process of platelet formation and growth.

In view of these potential defects, conventional anneals to cause platelet formation and growth may not generate the best quality of transferred layers. Regardless of the nature and formation mechanism of the various defects, controlling the cleanliness and strength of bond interface as well as the platelet formation is critical to reducing or eliminating layer transfer defects.

According to the method of the present invention, a uniform cleave plane may be formed by photon assisted platelet nucleation and growth. Such a method advantageously reduces the incidence of the defects cited above that may occur in convention methods. In some embodiments, the donors are irradiated with ultraviolet light, visible light, or infrared light. According to some embodiments, a light source with wavelength ranging from 0.3 micrometer ($\mu M$) to 3 micrometers is used to treat the implanted donor wafer. Depending on the light source used, the wafer may be heated up to a certain temperature. The uniform nucleation and growth of platelets are facilitated by the photon absorption of both crystal lattice, free carriers, and point defects, which occurs at a much lower temperature than the case of phonon (thermal) assisted platelet formation and growth as occurs in a furnace anneal process.

Since the photon-assisted platelet formation process involves minimum long-range diffusion of both implanted hydrogen as well as vacancies, the implanted hydrogen and vacancies are efficiently locked in platelets without undesired out-diffusion. The overall benefits of this photon-assisted platelet formation include but not limited the following:

1. Uniform distribution of platelet size and associated stress in the layer to be transferred; and 2. More efficient utilization of implanted species, which further lowers thermal budget for layer transfer and suppress Ostwald ripening process in platelet growth.

The combined effect of the above two leads substantially reduced defects in layer transfer. For example, empirical results to date have shown that light point defects, in particular, are substantially reduced due to the better platelet formation control achieved by the method of the present invention.

I. Structures for Use According to the Method of the Present Invention

The substrates for use in the present invention include a monocrystalline semiconductor donor substrate and a carrier substrate. In general, the monocrystalline semiconductor donor substrate comprises two major, generally parallel surfaces, one of which is a front surface of the substrate and the other of which is a back surface of the substrate, a circumferential edge joining the front and back surfaces, a bulk region between the front and back surfaces and a central plane roughly equidistant between the front and back surfaces. Since semiconductor wafers, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the monocrystalline semiconductor donor substrate may be substantially identical. A surface is referred to as a "front surface" or a "back surface" merely for convenience and generally to distinguish the surface upon which the operations of method of the present invention are performed. As described throughout this specification, the operation, e.g., ion implantation, irradiation, oxygen plasma activation, etc., is stated to occur on the front surface of the substrate. This naming convention does not exclude carrying out identical such operations, or different operations, on the back surface of the donor substrate. In some embodiments, certain operations, e.g., irradiation, may occur on the front surface and the back surface. In the context of the present invention, one or more insulating layers may be prepared on the front surfaces of either or both the carrier substrate and the monocrystalline semiconductor donor substrate. Upon completion of conventional bonding and wafer thinning steps, the monocrystalline semiconductor donor substrate forms the semiconductor device layer of the semiconductor-on-insulator (e.g., silicon-on-insulator) composite structure.

In some embodiments, the monocrystalline semiconductor donor substrate comprises a semiconductor wafer. In preferred embodiments, the semiconductor wafer comprises a material selected from the group consisting of silicon, sapphire, gallium arsenide, gallium nitride, gallium oxide, aluminum gallium nitride, indium phosphide, silicon carbide, silicon germanium, germanium, and combinations thereof. The monocrystalline semiconductor donor substrate of the present invention typically has a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the semiconductor wafer comprises a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, the single crystal silicon handle wafers, e.g., donor wafer and carrier wafer, have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the monocrystalline semiconductor donor substrate comprises interstitial oxygen in concentrations that are generally achieved by the Czochralski-growth method. In some embodiments, the monocrystalline semiconductor donor substrate comprises oxygen in a concentration between about 4 PPMA and about 18 PPMA. In some embodiments, the monocrystalline semiconductor donor substrate comprises oxygen in a concentration between about 10 PPMA and about 35 PPMA. In some embodiments, the monocrystalline semiconductor donor substrate comprises oxygen in a concentration of no greater than about 12 PPMA, such as less than about 10 PPMA. Interstitial oxygen may be measured according to SEMI MF 1188-1105.

The monocrystalline semiconductor donor substrate may have any resistivity obtainable by the Czochralski or float zone methods. Accordingly, the resistivity of the monocrystalline semiconductor donor substrate is based on the requirements of the end use/application of the structure of the present invention. The resistivity may therefore vary from milliohm or less to megaohm or more. In some embodiments, the monocrystalline semiconductor donor substrate comprises a p-type or an n-type dopant. Suitable dopants include boron (p type), gallium (p type), aluminum (p type), indium (p type), phosphorus (n type), antimony (n type), and arsenic (n type). The dopant concentration is selected based on the desired resistivity of the handle wafer. In some embodiments, the single crystal semiconductor handle substrate comprises a p-type dopant. In some embodiments, the monocrystalline semiconductor donor substrate is a single crystal silicon wafer comprising a p-type dopant, such as boron. In some embodiments, the monocrystalline semiconductor donor substrate has a relatively low minimum bulk resistivity, such as below about 100 ohm-cm, below about 50 ohm-cm, below about 1 ohm-cm, below about 0.1 ohm-cm, or even below about 0.01 ohm-cm.

In some embodiments, the monocrystalline semiconductor donor substrate has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the monocrystalline semiconductor donor substrate has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The monocrystalline semiconductor donor substrate may comprise single crystal silicon. The monocrystalline semiconductor donor substrate may have, for example, any of (100), (110), or (111) crystal orientation, and the choice of crystal orientation may be dictated by the end use of the structure.

In some embodiments, the major surfaces of the monocrystalline semiconductor donor substrate may be untreated prior to the operations of the method of the present invention. That is, the monocrystalline semiconductor donor substrate may be sliced and polished, but are not further treated to have an oxidizing or nitriding layer. In some embodiments, the monocrystalline semiconductor donor substrate comprises no more than a native silicon oxide layer. In some embodiments, one of more of the major surfaces of the monocrystalline semiconductor donor substrate may be oxidized prior to ion implantation. In preferred embodiments, the front surface layer, i.e., the layer through which hydrogen ions or combination of hydrogen ions and helium ions are implanted is oxidized prior to ion implantation. It is desirable to have a thermal interface at the top Silicon/BOX interface to keep interface density low. The monocrystalline semiconductor donor substrate should not be oxidized at an elevated temperature after the implant, which may cause wafer blister. In some embodiments, one of more of the major surfaces of the monocrystalline semiconductor donor substrate may be nitrided prior to ion implantation. In preferred embodiments, the front surface layer, i.e., the layer through which helium and hydrogen ions are implanted is nitrided prior to ion implantation.

The monocrystalline semiconductor donor substrate may be thermally oxidized in a furnace such as an ASM A400. The temperature may range from 750° C. to 1100° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprises a mixture of inert gas, such as Ar or $N_2$, and oxidizing gases, such as $O_2$ and water vapor (a "wet oxidation"). In an exemplary embodiment, donor wafers may be loaded into a vertical furnace, such as an A400. The temperature is ramped to the oxidizing temperature with a mixture of $N_2$ and $O_2$. At the desired temperature water vapor is introduced into the gas flow. After desired oxide thickness has been obtained, the water vapor and $O_2$ are turned off and the furnace temperature is reduced and wafers are unloaded from the furnace. In some embodiments, the oxidation layer has a thickness between about 1 nanometer and about 5000 nanometers, such as between about 1 nanometer and about 1000 nanometers, or between about 1 nanometer and about 100 nanometers, between about 1 nanometer and about 50 nanometers.

After oxidation, wafer cleaning is optional. If desired, the wafers can be cleaned, for example, in a standard SC1/SC2 solution.

II. Ion Implantation

According to the method of the present invention, a monocrystalline semiconductor donor substrate, such as a semiconductor wafer, that has been etched and polished and optionally oxidized, is subjected to ion implantation to form a damage layer in the donor substrate. Ion implantation may be carried out in a commercially available instrument, such as an Applied Materials Quantum II, a Quantum LEAP, or a Quantum X. Implanted ions include helium ions or hydrogen ions or a combination thereof. The Implanted ions may include $He^+$, $H^+$, $H_2^+$, or combinations thereof. In some embodiments, hydrogen ions, helium ions, or a combination of hydrogen ions and helium ions are implanted through a front surface of the monocrystalline semiconductor donor substrate to an average depth $D_1$ as measured from the front surface toward a central plane. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth, $D_1$, of implantation determines the thickness of the single crystal semiconductor device layer in the final SOI structure. The ions may be implanted to a depth, $D_1$, between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. If both hydrogen and helium are implanted, preferably, the He implant peak concentration should be within about +/−1000 angstroms of the peak of the hydrogen implant, more preferably within about +/−500 angstroms, and still more preferably within about +/−100 angstroms of the peak of the hydrogen implant. The helium implant may occur before, simultaneously with, or after the hydrogen implant.

In some embodiments it may be desirable to subject the monocrystalline semiconductor donor substrates, e.g., single crystal silicon donor wafers, to a clean after the implant. In some preferred embodiments, the clean could include a Piranha clean followed by a DI water rinse and SC1/SC2 cleans. In some embodiments it may be desirable to subject wafers to a clean after the implant. In some preferred embodiments, the clean could include a Piranha clean followed by a DI water rinse and SC1/SC2 cleans.

III. Irradiation of Implanted Monocrystalline Semiconductor Donor Substrate

According to the method of the present invention, the implanted monocrystalline semiconductor donor substrate is irradiated with light to thereby form a cleave plane at or near the damage layer caused by ion implantation. The cleave plane comprises uniform platelets that decrease defects on the transferred device layer. The uniform nucleation and growth of platelets are facilitated by the photon absorption of both crystal lattice, free carriers, and point defects, which occurs at a much lower temperature than the case of phonon (thermal) assisted platelet formation and growth as occurs in a furnace anneal process. According to some embodiments, the front surface, the back surface, or both the front and the back surfaces of the monocrystalline semiconductor donor substrate is irradiated with light at an intensity and duration sufficient to increase a temperature of the monocrystalline semiconductor donor substrate up to 450° C. and thereby form a cleave plane in the monocrystalline semiconductor donor substrate.

Figure 1B:
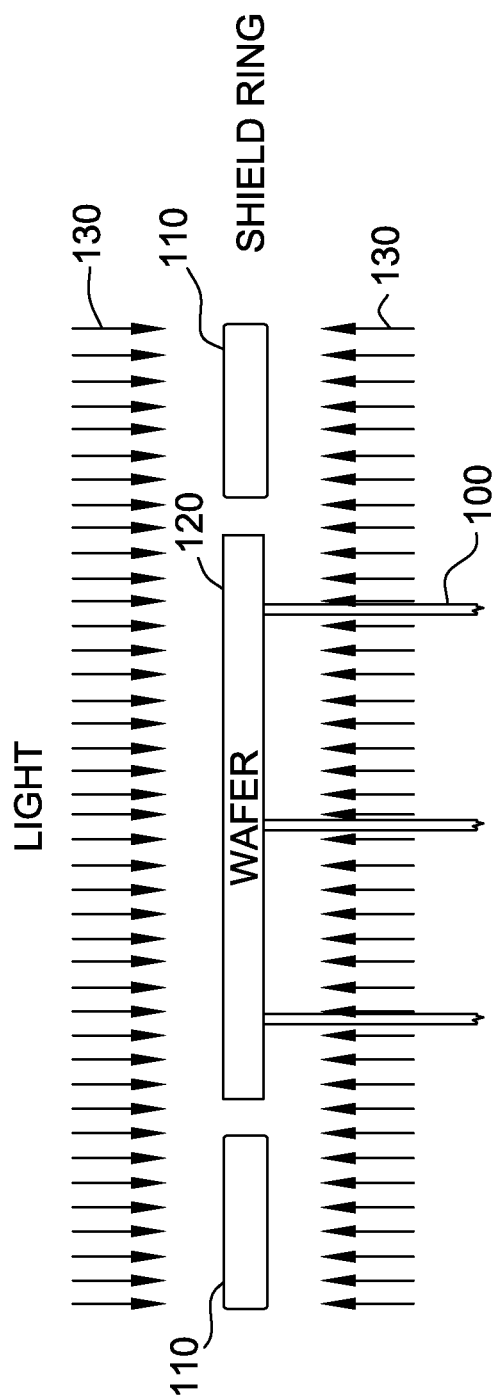

In some embodiments, the monocrystalline semiconductor donor structure is loaded into a rapid thermal processing tool. A suitable exemplary tool is the RTP Centura™ from Applied Materials. The monocrystalline semiconductor donor structure, e.g., a monocrystalline semiconductor wafer is picked by a robot at room temperature and placed on a susceptor, e.g., a SiC coated graphite susceptor, in the chamber of the reactor. See FIG. 1A, depicting a susceptor 10 holding a wafer 20, while it is being irradiated 30. With reference to FIG. 1B, in some tools, a wafer 120 may be supported by, e.g., 3 support pins 100 and shielded by a shield ring 110 while it is being irradiated 130, as typically used in many industrial rapid thermal processing tools. In some embodiments, the light is ultraviolet light or visible light, or a combination of ultraviolet light and visible light. In some embodiments, the light is infrared light, or a combination of ultraviolet light and infrared light, which is achievable by using a combination of UV and IR lamps. Once a wafer 120 is placed in the tool, the lamps are turned on. Suitable lamps for the method of the present invention include tungsten halogen quartz lamps, xenon arc plasma lamps, and carbon dioxide laser. Tungsten halogen lamps are suitable for irradiation in a spectrum generally above about 500 nanometers (0.5 micrometers), such as between about 500 nanometers (0.5 micrometers) to about 2000 nanometers (2.0 micrometers), or between about 500 nanometers (0.5 micrometers) to about 1500 nanometers (1.5 micrometers), or between about 500 nanometers (0.5 micrometers) to about 2500 nanometers (2.5 micrometers). Suitable lamps include quartz halogen IR lamps from Rhenium Alloy and Ushio. Xenon arc plasma lamps are suitable for irradiation in a spectrum generally above about 300 nanometers (0.3 micrometers), such as between about 300 nanometers (0.3 micrometers) and about 1100 nanometers (1.1 micrometers) In some embodiments, the light has a wavelength between about 0.3 micrometer and about 3 micrometers. In some embodiments, the light has a wavelength between about 0.5 micrometer and about 2 micrometers.

In some embodiments, the duration of irradiation is between about 1 millisecond and about 5 minutes, such as between about 10 seconds and about 5 minutes, or between about 30 seconds and about 5 minutes, or between about 30 seconds and about 180 seconds, or between about 60 seconds and about 120 seconds. Depending on the type of light sources and the thermal mass of the wafer support mechanisms, the processing time is controlled accordingly. In some embodiments, the monocrystalline semiconductor donor structure is rotated, e.g., on a susceptor, during irradiation. The monocrystalline semiconductor donor structure may be rotated at a rate between about 5 rotations per minute to about 100 rotations per minute.

In some embodiments, irradiation causes an increase in temperature of the wafer, which may be measured at the surface or in the bulk of the wafer. In some embodiments, the temperature of the monocrystalline semiconductor donor substrate is increased to a temperature between about 200° C. and about 450° C., such as between about 250° C. and about 350° C. In some embodiments, the temperature of the monocrystalline semiconductor donor substrate is increased to a temperature up to about 350° C., such as between about 30° C. and about 350° C., or between about 200° C. and about 350° C.

Figure 2:
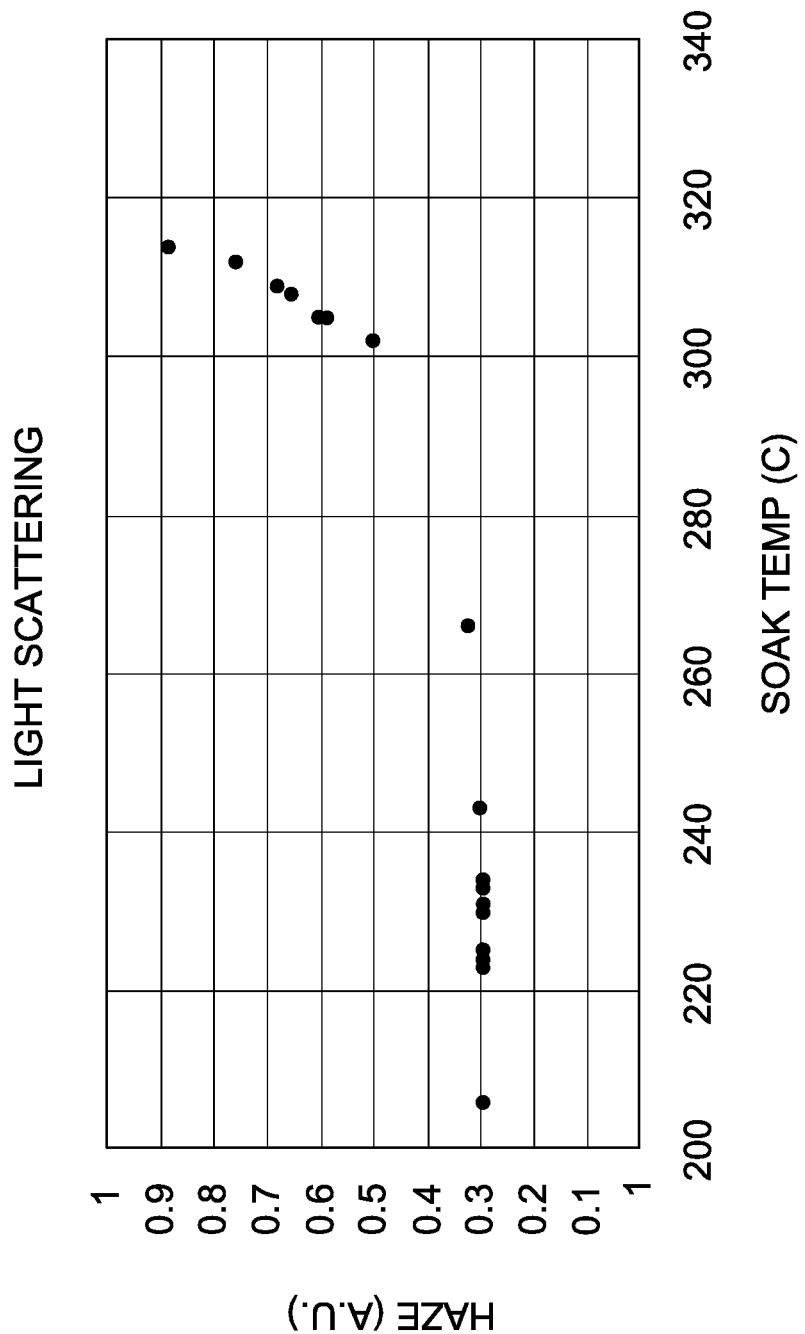
FIG. 2 is a chart depicting the onset of haze on the surface of a wafer treated according to the method of the present invention.
Figure 3A:
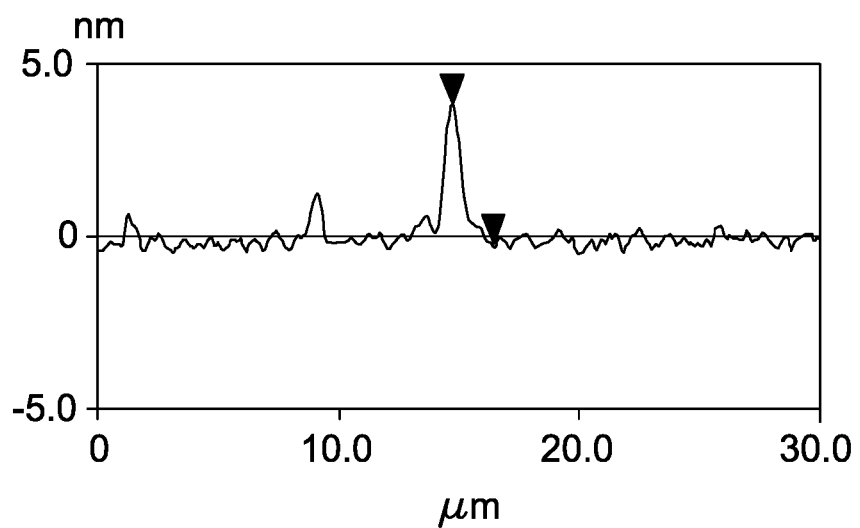
FIGS. 3A and 3B depict surface roughness measurement by Atomic Force Microscopy of a wafer treated according to the method of the present invention.

The duration of irradiation is sufficient to increase surface haze on the front surface, the back surface, or both the front and the back surfaces of the monocrystalline semiconductor donor substrate. A perceptible increase in surface haze may serve as an end point for wafer irradiation. See, e.g., FIG. 2 depicting a noticeable increase in haze as the temperature of the wafer increases during irradiation. The surface haze can be measured offline by a commercial surface inspection tool such as KLA-Tencor Surface Scan and determine the onset of haze change. The onset of platelet formation can be measured with AFM measurement as shown in FIG. 3A. Bumps of up to about a micrometer in diameter and ranging from about 1 to about 5 nm in height can be found as a result of platelet nucleation and growth. For example, observable bump lateral dimension may be in the range of 1 to 2 micrometers, such as about 1.6 micrometer. The height may range from about 1 to about 5 nanometers, such as about 4 nanometers. The root mean square roughness of the surface may be between about 1 nanometer and about 2 nanometers, such as about 1.4 nanometer. The average surface roughness may be between about 0.1 and about 1 nanometer, such as about 0.4 nanometer. The onset of haze increase by 20% is considered the end point for irradiation. When over processed, platelets grow big enough to form blisters and cause bonding voids or layer transfer defects. Haze control is recommended as a production-friendly nondestructive in-line monitor method. The increase in haze is indicative of the growth of uniform platelets in the cleave plane.

IV. Plasma Activation

In some embodiments, the ion-implanted and optionally cleaned monocrystalline semiconductor donor substrate having the cleave plane therein is subjected to oxygen plasma and/or nitrogen plasma surface activation. In some embodiments, the oxygen plasma surface activation tool is a commercially available tool, such as those available from EV Group, such as EVG0810LT Low Temp Plasma Activation System. The ion-implanted and optionally cleaned monocrystalline semiconductor donor substrate is loaded into the chamber. The chamber is evacuated and backfilled with $O_2$ or $N_2$ to a pressure less than atmospheric to thereby create the plasma. The monocrystalline semiconductor donor substrate is exposed to this plasma for the desired time, which may range from about 1 second to about 120 seconds. Oxygen or nitrogen plasma surface oxidation is performed in order to render the front surface of the monocrystalline semiconductor donor substrate hydrophilic and amenable to bonding to a single crystal semiconductor handle substrate prepared according to the method described above. After plasma activation, the activated surface is rinsed with deionized water. The monocrystalline semiconductor donor substrate is then spun dry prior to bonding. Oxygen plasma surface oxidation is performed in order to render the front surface of the monocrystalline semiconductor donor substrate hydrophilic and amenable to bonding to a carrier substrate.

V. Wafer to Wafer Bonding

The hydrophilic front surface layer of the monocrystalline semiconductor donor substrate and a hydrophilic surface, e.g., the front surface, of a carrier substrate are next brought into intimate contact to thereby form a bonded structure.

The carrier substrate, like the donor substrate, generally comprises two major, generally parallel surfaces, one of which is a front surface of the substrate and the other of which is a back surface of the substrate, a circumferential edge joining the front and back surfaces, and a central plane between the front and back surfaces. In some embodiments, the carrier substrate comprises a semiconductor wafer. In preferred embodiments, the semiconductor wafer comprises a material selected from the group consisting of silicon, sapphire, quartz, gallium arsenic, silicon carbide, silicon germanium, germanium, lithium niobate ($LiNbO_3$), barium titanate ($BaTiO_3$), and combinations thereof. In particularly preferred embodiments, the semiconductor wafer comprises a wafer sliced from a single crystal silicon wafer which has been sliced from a single crystal ingot grown in accordance with conventional Czochralski crystal growing methods. In some preferred embodiments, the carrier substrate comprises a silicon wafer having an oxidation layer on a surface thereof. In some preferred embodiments the front surface of the donor substrate and the front surface of the carrier substrate have substantially identical dimensions. The carrier substrate may also be a material having a substantially different coefficient of thermal expansion that silicon. For example, the carrier substrate may be a sapphire wafer or a quartz wafer.

In some embodiments, the carrier wafer may comprise multiple layers of insulating material. The carrier wafer may comprise two insulating layers, three insulating layers, or more. In some embodiments, each insulating layer may comprise a material selected from the group consisting of silicon dioxide, silicon nitride, siliconoxynitride, and any combination thereof. Each insulating layer may have a thickness of at least about 10 nanometer thick, such as between about 10 nanometers and about 10,000 nanometers, between about 10 nanometers and about 5,000 nanometers, between about 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers.

The carrier wafer, e.g., silicon, sapphire, or quartz, may be subjected to an oxidation process and oxygen plasma activation. Stated another way, both front surfaces of the monocrystalline semiconductor donor substrate and the carrier wafer may be subjected to similar pretreatments and may both contain activated oxidized front surfaces.

Since the mechanical bond is relatively weak, the bonded structure is further annealed to solidify the bond between the donor wafer and the carrier wafer. An example of a suitable tool might be a simple Box furnace, such as a Blue M model. In some embodiments, the bonded structure is annealed at a temperature of from about 300° C. to about 700° C., from about 400° C. to about 600° C., such as between about 400° C. and about 450° C., or even between about 450° C. and about 600° C., or between about 350° C. and about 450° C. Increasing the thermal budget will have a positive effect on the bond strength. The bonded structure may be annealed at a temperature between about 150° C. and about 500° C., or between about 150° C. and about 350° C., such as between about 150° C. and about 300° C., preferably at a temperature of about 225° C. Thermal annealing within these temperatures ranges is sufficient to form a thermally activated cleave plane. Thermal annealing may occur for a duration of from about 0.5 hours to about 10 hour, such as between about 30 minutes hours and about 5 hours, or between 30 minutes and 3 hours, such as about 1 hour or about 2 hours.

In some embodiments, the anneal may occur at relatively high pressures, such as between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa. In conventional bonding methods, the temperature is likely limited by the "autocleave". This occurs when the pressure of the platelets at the implant plane exceeds the external isostatic pressure. Accordingly, conventional anneal may be limited to bonding temperatures between about 350° C. and about 400° C. because of autocleave. After implantation and bond, the wafers are weakly held together. But the gap between the wafers is sufficient to prevent gas penetration or escape. Weak bonds can be strengthened by heat treatments, but the cavities formed during implant are filled with gas. While heating, the gas inside the cavities pressurizes. It is estimated that the pressure may reach 0.2-1 GPa (Cherkashin et al., J. Appl. Phys. 118, 245301 (2015)), depending on the dosage. When the pressure exceeds a critical value, the layer delaminates. This is referred to as an autocleave or thermal cleave. It prevents higher temperature or longer time in the anneal. According to some embodiments of the present invention, bonding occurs at elevated pressures, e.g., between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa, which thereby enables bonding at elevated temperatures. In conventional bonding anneals, the edge of both the handle wafer and donor wafer may become far apart due to the roll off. In this area, there is no layer transfer. It is called the terrace. Pressurized bonding is expected to reduce this terrace, extending the SOI layer further out towards the edge. The mechanism is based on trapped pockets of air being compressed and "zippering" outwards. After the thermal anneal to activate the cleave plane, the bonded structure may be cleaved.

After the thermal anneal, the bond between the donor substrate and the carrier substrate is strong enough to initiate layer transfer via cleaving the bonded structure at the cleave plane. Cleaving may occur according to techniques known in the art. In some embodiments, the bonded wafer may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the monocrystalline semiconductor donor substrate, thereby leaving a single crystal semiconductor device layer on the semiconductor-on-insulator composite structure.

The disclosed technique may be used for a range of layer transfer applications where it is required to enable layer transfer at a low temperature. These include layer transfer of silicon layers to dissimilar substrates such as sapphire, crystalline or glass quartz or other insulating and semiconducting substrates. The technique may also be used to allow layer transfer of other semiconducting top layers to a substrate if the semiconductor can be ion split. Some examples might be GaAs, SiC, SiGe, or Ge. The applicable heat treatment temperatures and times and dose ranges for these applications are not known at this time.

The cleaved, multilayer structure may be subjected to a cleaning process designed to remove thin thermal oxide and clean particulates from the surface. In some embodiments, the transferred semiconductor device layer may be brought to the desired thickness and smoothness by subjecting to a vapor phase HCl etch process in a horizontal flow single wafer epitaxial reactor using $H_2$ as a carrier gas. In some embodiments, the semiconductor device layer may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers. Thick film device layers may have a device layer thickness between about 1.5 micrometers and about 20 micrometers. Thin film device layers may have a thickness between about 0.01 micrometer and about 0.20 micrometer.

In some embodiments, an epitaxial layer may be deposited on the transferred device layer. A deposited epitaxial layer may comprise substantially the same electrical characteristics as the underlying device layer. Alternatively, the epitaxial layer may comprise different electrical characteristics as the underlying device layer. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise a dopant selected from among boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 10 nanometers and about 20 micrometers, between about 20 nanometers and about 3 micrometers, such as between about 20 nanometers and about 2 micrometers, such as between about 20 nanometers and about 1.5 micrometers or between about 1.5 micrometers and about 3 micrometers.

Having described the invention in detail, it will be apparent that modifications and variations are possible without departing from the scope of the invention defined in the appended claims.

The following non-limiting examples are provided to further illustrate the present invention.

EXAMPLES

Example 1

Hydrogen and Helium co-implanted donor wafers were processed in a rapid thermal processing tool, the RTP Centura™ from Applied Materials. The tungsten halogen lamps in the reactor provided a light spectrum from 0.5 to 2 um. The wafer was picked by a robot at room temperature and placed on a SiC coated graphite susceptor in the chamber of the reactor as shown in FIG. 1A. The lamps were turned on. The wafer temperature rises quickly as a result of light absorption. The end temperature was controlled to be less than 350° C. by lamp power and process time. The total irradiation duration was about 120 seconds.

Figure 3B:
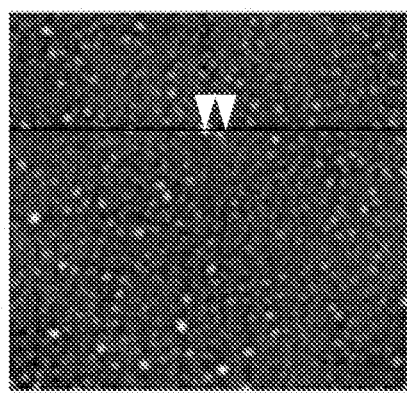

The onset of platelet growth was indicated by the rise in surface haze as shown in FIG. 2. FIG. 2 depicts the surface haze of donor wafers after $H_2$/He co-implant measured by KLA-Tencor SP2. The platelet growth induced surface topography was confirmed by the AFM measurement shown in FIGS. 3A and 3B, and 3C. FIGS. 3A and 3B depict surface roughness measurement by Atomic Force Microscopy on a sample irradiated to a temperature of 315° C. for 120 s. FIG. 3A shows the cross section of the two bumps as indicated in FIG. 3B. AFM is used to confirm the surface haze change as detected by KLA-Tencor Surface Scan tool as well as the platelet formation which leads to surface bumps. Some of the platelets have grown to micrometers in diameter and 4 nm in height.

Figure 4:
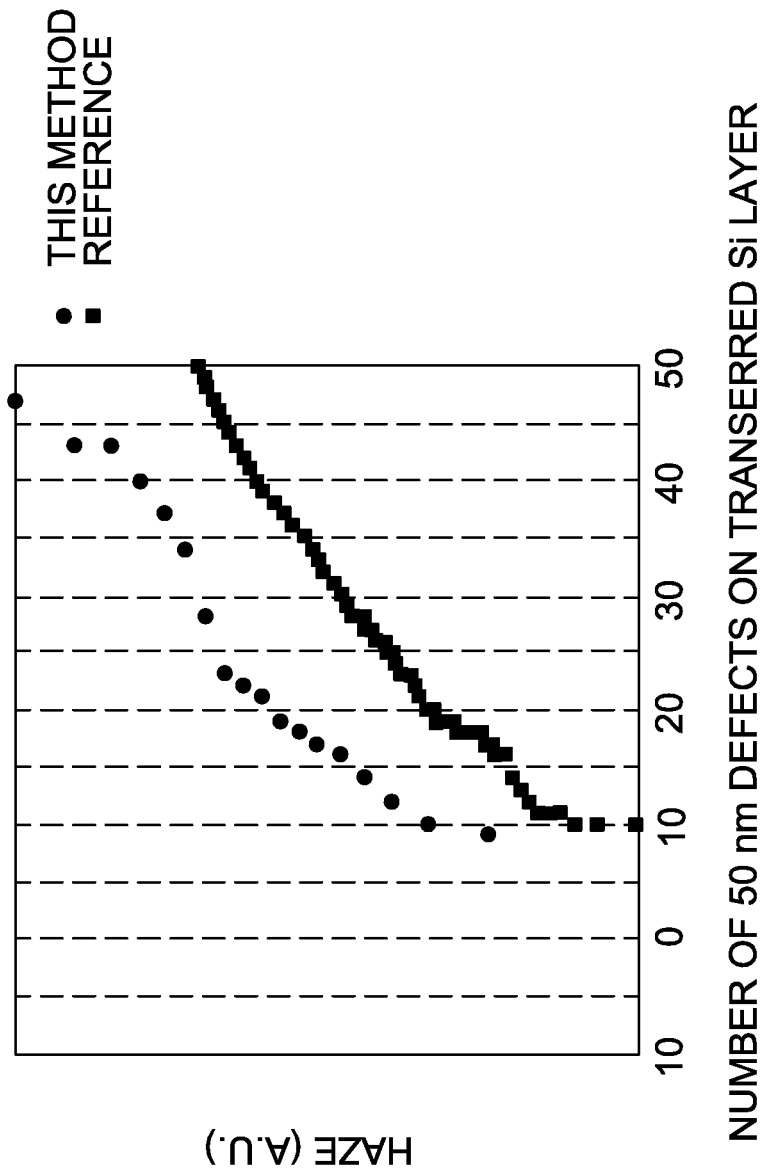
FIG. 4 is a chart depicting the decrease in defects detected in wafers treated according to the method of the present invention.

Treated wafers were bonded to carrier substrates and cleaved. The improvement in light point defects on the surface of transferred layers by the light-assisted platelet formation is shown in FIG. 4. The data were obtained by a KLA-Tencor SP2, and 50 nm LPDs were measured. The light point defects are substantially reduced with the better controlled platelet formation process compared to the reference. FIG. 4 shows the distribution of surface defects at 50 nm size. The vertical axis is labelled HAZE is in percentage. FIG. 4 shows that with the method disclosed in this application there are less defect counts on the surface of the silicon device layer at the end of SOI processing compared to reference process where no photon-assisted platelet formation mechanism is involved. Fewer surface defects results in better quality device layer surfaces.

Example 2

Hydrogen and Helium co-implanted donor wafers were processed in a rapid thermal processing tool. The tungsten halogen lamps in the reactor provided a light spectrum from 0.5 to 2 um. The wafer was picked by a robot at room temperature and placed on a SiC coated graphite susceptor in the chamber of the reactor as shown in FIG. 1A. The lamps were turned on. The wafer temperature rises quickly as a result of light absorption. The end temperature was controlled to be either 230° C. or 300° C. by lamp power and process time. The total irradiation duration was about 60 seconds.

Figure 5:
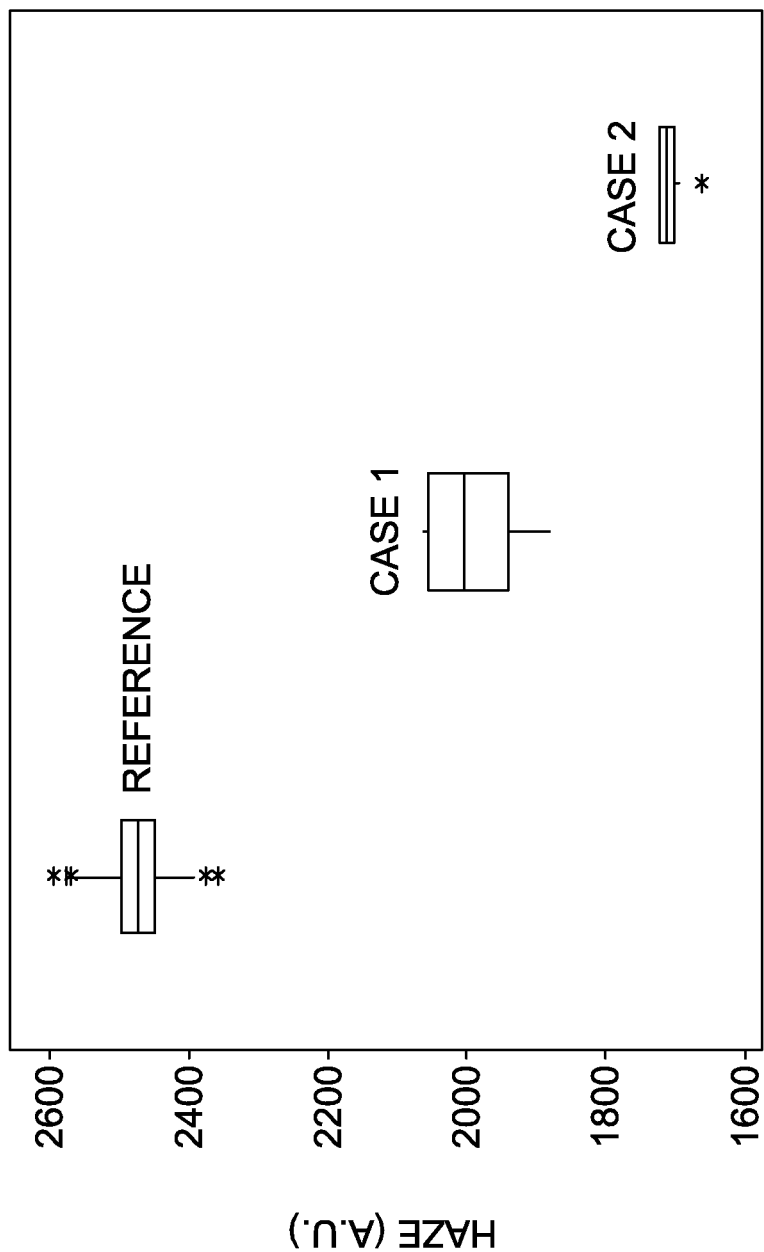
FIG. 5 is a chart depicting the decrease in haze on the surface of an as-cleaved structure resulting from wafers treated according to the method of the present invention.

Treated wafers were bonded to carrier substrates and cleaved. The improvement in haze, compared to reference wafers, on the surface of transferred layers by the light-assisted platelet formation is shown in FIG. 5. The data were obtained by a KLA-Tencor SP2. The higher temperatures achieved in the irradiated wafers resulted in lower haze on the surface of the transferred layer. Lower haze is indicative of a better surface structure for eventual device formation.

In view of the above, it will be seen that the several objects of the invention are achieved. As various changes could be made in the above-described process without departing from the scope of the invention, it is intended that all matters contained in the above description be interpreted as illustrative and not in a limiting sense. In addition, when introducing elements of the present invention or the preferred embodiment(s) thereof, the articles "a," "an," "the" and "said" are intended to mean that there are one or more of the elements. The terms "comprising," "including" and "having" are intended to be inclusive and mean that there may be additional elements other than the listed elements.

This written description uses examples to disclose the invention and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of preparing a monocrystalline semiconductor donor substrate, the method comprising:
   implanting hydrogen ions, helium ions, or a combination of hydrogen ions and helium ions through a front surface of the monocrystalline semiconductor donor substrate to an average depth $D_1$ as measured from the front surface toward a central plane, wherein the monocrystalline semiconductor donor substrate comprises two major, generally parallel surfaces, one of which is the front surface of the monocrystalline semiconductor donor substrate and the other of which is a back surface of the monocrystalline semiconductor donor substrate, a circumferential edge joining the front and back surfaces of the monocrystalline semiconductor donor substrate, and the central plane between the front and back surfaces of the monocrystalline semiconductor donor substrate; and
   irradiating the front surface, the back surface, or both the front and the back surfaces of the monocrystalline semiconductor donor substrate with light at an intensity and duration sufficient to increase a temperature of the monocrystalline semiconductor donor substrate to between about 200° C. and about 450° C. and thereby form a cleave plane in the monocrystalline semiconductor donor substrate, wherein the monocrystalline semiconductor donor substrate is rotated during irradiation at a rate between about 5 rotations per minute to about 100 rotations per minute.

2. The method of claim 1 wherein the monocrystalline semiconductor donor substrate comprises a semiconductor wafer.

3. The method of claim 2 wherein the semiconductor wafer comprises a material selected from the group consisting of silicon, sapphire, gallium arsenide, gallium nitride, gallium oxide, aluminum gallium nitride, indium phosphide, silicon carbide, silicon germanium, germanium, and combinations thereof.

4. The method of claim 2 wherein the semiconductor wafer comprises a wafer sliced from a single crystal silicon ingot grown by the Czochralski method.

5. The method of claim 1 wherein the front surface of the monocrystalline semiconductor donor substrate comprises an oxidation layer prior to implanting hydrogen ions, helium ions, or a combination of hydrogen ions and helium ions.

6. The method of claim 5 wherein the oxidation layer has a thickness between about 1 nanometer and about 5000 nanometers.

7. The method of claim 1 wherein the light is ultraviolet light, visible light, or a combination of ultraviolet light and visible light.

8. The method of claim 1 wherein the light is ultraviolet light, infrared light, or a combination of infrared light and visible light.

9. The method of claim 1 wherein the light has a wavelength between about 0.3 micrometer and about 3 micrometers.

10. The method of claim 1 wherein the light has a wavelength between about 0.5 micrometer and about 2 micrometers.

11. The method of claim 1 wherein the duration of irradiation is between about 1 millisecond and about 5 minutes.

12. The method of claim 1 wherein the duration of irradiation is between about 30 seconds and about 5 minutes.

13. The method of claim 1 wherein the duration of irradiation is sufficient to increase surface haze on the front surface, the back surface, or both the front and the back surfaces of the monocrystalline semiconductor donor substrate.

14. The method of claim 1 wherein the increasing the temperature of the monocrystalline semiconductor donor substrate is to about 350° C.

15. The method of claim 1 further comprising activating the monocrystalline semiconductor donor substrate having the cleave plane therein via oxygen plasma surface activation.

16. The method of claim 15 further comprising bonding the activated front surface of the monocrystalline semiconductor donor substrate having the cleave plane therein to a surface of a carrier substrate to thereby form a bonded structure comprising the carrier substrate and the monocrystalline semiconductor donor substrate having the cleave plane.

17. The method of claim 16 wherein the carrier substrate is a silicon wafer.

18. The method of claim 17 wherein the silicon wafer comprises a SiO2 surface layer.

19. The method of claim 17 further comprising annealing the bonded structure.

20. The method of claim 17 wherein the bonded structure is annealed at a temperature between about 150° C. and about 500° C.

21. The method of claim 17 further comprising cleaving the bonded structure along the cleave plane to thereby form a multilayer structure comprising the carrier substrate and a monocrystalline semiconductor device layer transferred from the monocrystalline semiconductor donor substrate.

22. The method of claim 16 wherein the carrier substrate is a sapphire wafer.

23. The method of claim 16 wherein the carrier substrate is a quartz wafer.

24. A method of preparing a multilayer structure, the method comprising:
   implanting hydrogen ions, helium ions, or a combination of hydrogen ions and helium ions through a front surface of a monocrystalline semiconductor donor substrate to an average depth $D_1$ as measured from the front surface toward a central plane, wherein the monocrystalline semiconductor donor substrate comprises two major, generally parallel surfaces, one of which is the front surface of the monocrystalline semiconductor donor substrate and the other of which is a back surface of the monocrystalline semiconductor donor substrate, a circumferential edge joining the front and back surfaces of the monocrystalline semiconductor donor substrate, and the central plane between the front and back surfaces of the monocrystalline semiconductor donor substrate;
   irradiating the front surface, the back surface, or both the front and the back surfaces of the monocrystalline semiconductor donor substrate with light at an intensity and duration sufficient to increase a temperature of the monocrystalline semiconductor donor substrate to between about 200° C. and about 450° C. and thereby form a cleave plane in the monocrystalline semiconductor donor substrate, wherein the duration of irradiation is between about 1 millisecond and about 5 minutes;
   activating the monocrystalline semiconductor donor substrate having the cleave plane therein via oxygen plasma surface activation;
   bonding the activated front surface of the monocrystalline semiconductor donor substrate having the cleave plane therein to a surface of a carrier substrate to thereby form a bonded structure comprising the carrier substrate and the monocrystalline semiconductor donor substrate having the cleave plane;
   annealing the bonded structure; and
   cleaving the bonded structure along the cleave plane to thereby form a multilayer structure comprising the carrier substrate and a monocrystalline semiconductor device layer transferred from the monocrystalline semiconductor donor substrate.

25. The method of claim 24 wherein the monocrystalline semiconductor donor substrate comprises a semiconductor wafer.

26. The method of claim 25 wherein the semiconductor wafer comprises a material selected from the group consisting of silicon, sapphire, gallium arsenide, gallium nitride, gallium oxide, aluminum gallium nitride, indium phosphide, silicon carbide, silicon germanium, germanium, and combinations thereof.

27. The method of claim 26 wherein the semiconductor wafer comprises a wafer sliced from a single crystal silicon ingot grown by the Czochralski method.

28. The method of claim 24 wherein the front surface of the monocrystalline semiconductor donor substrate comprises an oxidation layer prior to implanting hydrogen ions, helium ions, or a combination of hydrogen ions and helium ions.

29. The method of claim 28 wherein the oxidation layer has a thickness between about 1 nanometer and about 5000 nanometers.

30. The method of claim 24 wherein the light is ultraviolet light, visible light, or a combination of ultraviolet light and visible light.

31. The method of claim 24 wherein the light is ultraviolet light, infrared light, or a combination of infrared light and visible light.

32. The method of claim 24 wherein the light has a wavelength between about 0.3 micrometer and about 3 micrometers.

33. The method of claim 24 wherein the light has a wavelength between about 0.5 micrometer and about 2 micrometers.

34. The method of claim 24 wherein the duration of irradiation is between about 30 seconds and about 5 minutes.

35. The method of claim 24 wherein the monocrystalline semiconductor donor substrate is rotated during irradiation.

36. The method of claim 35 wherein the monocrystalline semiconductor donor substrate is rotated at a rate between about 5 rotations per minute to about 100 rotations per minute.

37. The method of claim 24 wherein the duration of irradiation is sufficient to increase surface haze on the front surface, the back surface, or both the front and the back surfaces of the monocrystalline semiconductor donor substrate.

38. The method of claim 24 wherein the increasing the temperature of the monocrystalline semiconductor donor substrate is to about 350° C.

39. The method of claim 24 wherein the carrier substrate is a silicon wafer.

40. The method of claim 39 wherein the silicon wafer comprises a SiO2 surface layer.

41. The method of claim 24 wherein the carrier substrate is a sapphire wafer.

42. The method of claim 24 wherein the carrier substrate is a quartz wafer.

43. The method of claim 24 wherein the bonded structure is annealed at a temperature between about 150° C. and about 500° C.

* * * * *